(12) United States Patent
Inuzuka

(10) Patent No.: US 10,865,497 B2
(45) Date of Patent: Dec. 15, 2020

(54) MANUFACTURING METHOD OF MASK

(71) Applicant: Sharp Kabushiki Kaisha, Sakai (JP)

(72) Inventor: Masahiro Inuzuka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/472,220

(22) PCT Filed: Sep. 28, 2017

(86) PCT No.: PCT/JP2017/035215
§ 371 (c)(1),
(2) Date: Jun. 21, 2019

(87) PCT Pub. No.: WO2019/064424
PCT Pub. Date: Apr. 4, 2019

(65) Prior Publication Data
US 2020/0091432 A1    Mar. 19, 2020

(51) Int. Cl.
| | | |
|---|---|---|
| *C25F 3/14* | (2006.01) | |
| *C23C 14/04* | (2006.01) | |
| *H01L 51/00* | (2006.01) | |
| *H01L 51/56* | (2006.01) | |
| *C25F 7/00* | (2006.01) | |

(52) U.S. Cl.
CPC ............... *C25F 3/14* (2013.01); *C23C 14/04* (2013.01); *C25F 7/00* (2013.01); *H01L 51/0011* (2013.01); *H01L 51/56* (2013.01)

(58) Field of Classification Search
CPC ................. C25F 3/02; C25F 3/14; C25F 7/00
See application file for complete search history.

(56) References Cited

U.S. PATENT DOCUMENTS

| | | | | |
|---|---|---|---|---|
| 8,329,021 | B2 * | 12/2012 | Garza | ................ C25F 3/14 |
| | | | | 205/666 |
| 9,365,947 | B2 * | 6/2016 | Uzoh | ................ H05K 1/115 |
| 2001/0014409 | A1 | 8/2001 | Cohen | |
| 2006/0207888 | A1 * | 9/2006 | Taylor | ................ H05K 3/07 |
| | | | | 205/646 |
| 2016/0148981 | A1 | 5/2016 | Matsueda | |

FOREIGN PATENT DOCUMENTS

| | | | |
|---|---|---|---|
| JP | 11-222664 A | 8/1999 | |
| JP | 2001-355095 A | 12/2001 | |
| JP | 2016-100296 A | 5/2016 | |
| WO | WO-2017045122 A1 * | 3/2017 | ............. C23C 14/24 |

OTHER PUBLICATIONS

Official Communication issued in International Patent Application No. PCT/JP2017/035215, dated Dec. 5, 2017.

* cited by examiner

*Primary Examiner* — Nicholas A Smith
(74) *Attorney, Agent, or Firm* — Keating & Bennett, LLP

(57) ABSTRACT

A manufacturing method of a mask sheet includes a film formation step for forming a metal layer provided with a plurality of openings on a mask substrate, and a shaping step for shaping the metal layer using pulse electrolysis.

6 Claims, 11 Drawing Sheets

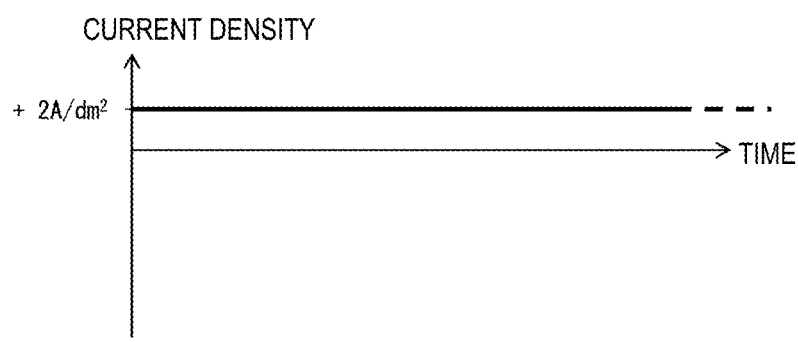
FIG. 8A  DIRECT CURRENT ELECTROLYSIS
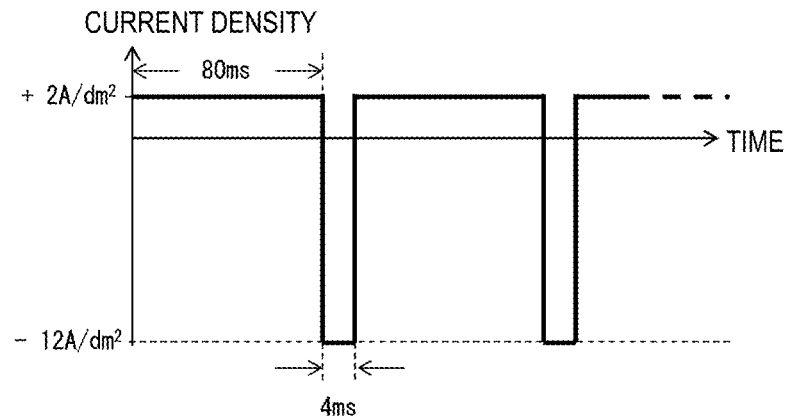
FIG. 8B  PULSE ELECTROLYSIS FIG. 11A
FIG. 11B
FIG. 11C
FIG. 11D
FIG. 11E
FIG. 11F
FIG. 11G
FIG. 11H
FIG. 11I
FIG. 11J
FIG. 11K

MANUFACTURING METHOD OF MASK

TECHNICAL FIELD

An aspect of the disclosure relates to a manufacturing method of a mask used when particles are vapor-deposited onto a display device during manufacture.

BACKGROUND ART

In the manufacture of a display device, in order to vapor-deposit particles for forming light-emitting elements, each corresponding to a subpixel, a mask (also referred to as a "metal mask") including a plurality of openings corresponding to the subpixels has been used. The openings of this mask are manufactured using an etching method or an electrolytic casting method (plating method). When an etching method is used, the mask can be manufactured at low cost, but it is difficult to form the openings at high resolution. On the other hand, when a plating method is used, the cost is higher than when an etching method is used, but there is a high degree of freedom in a pattern design of the openings. Thus, in the formation of openings, much focus is being placed on the plating method. In PTL 1, for example, there is disclosed a manufacturing method of a mask that uses such a plating method.

CITATION LIST

Patent Literature

PTL 1: JP 2016-100296 A (published May 30, 2016).

SUMMARY

Technical Problem

Nevertheless, in PTL 1, there is no mention of the type of plating method used when the openings are formed. Therefore, in PTL 1, due to the shapes of the openings formed in the mask, the particles are not uniformly vapor-deposited onto the display device during manufacture, and a shadow (step in film thickness) is formed on an end side of each of the openings. In this case, in a light-emitting element in which the particles are not uniformly vapor-deposited, defects such as color unevenness occur during light emission.

According to an aspect of the disclosure, an object of the disclosure is to achieve a manufacturing method of a mask capable of vapor-depositing particles within a plane of a light-emitting element in a substantially uniform manner.

Solution to Problem

To solve the problems described above, a manufacturing method of a mask according to an aspect of the disclosure is a manufacturing method of a mask used when particles are vapor-deposited onto a display device during manufacture, the manufacturing method including a film formation step for forming a metal layer including a plurality of openings on a mask substrate, and a shaping step for shaping the metal layer using pulse electrolysis.

Advantageous Effects of Disclosure

According to an aspect of the disclosure, an advantage of making it possible to vapor-deposit particles within a plane of a light-emitting element in a substantially uniform manner is achieved.

BRIEF DESCRIPTION OF DRAWINGS

FIGS. 8A and 8B are a diagram illustrating an example of changes over time in a current density when a metal layer is formed using direct current electrolysis, and a diagram illustrating an example of changes over time in a current density when a metal layer is formed using pulse electrolysis, respectively.

FIGS. 11A to 11K are diagrams illustrating an example of the manufacturing method of a mask sheet according to a second embodiment.

DESCRIPTION OF EMBODIMENTS

Overview of Structure and Manufacturing Method of Display Device

Figure 1:
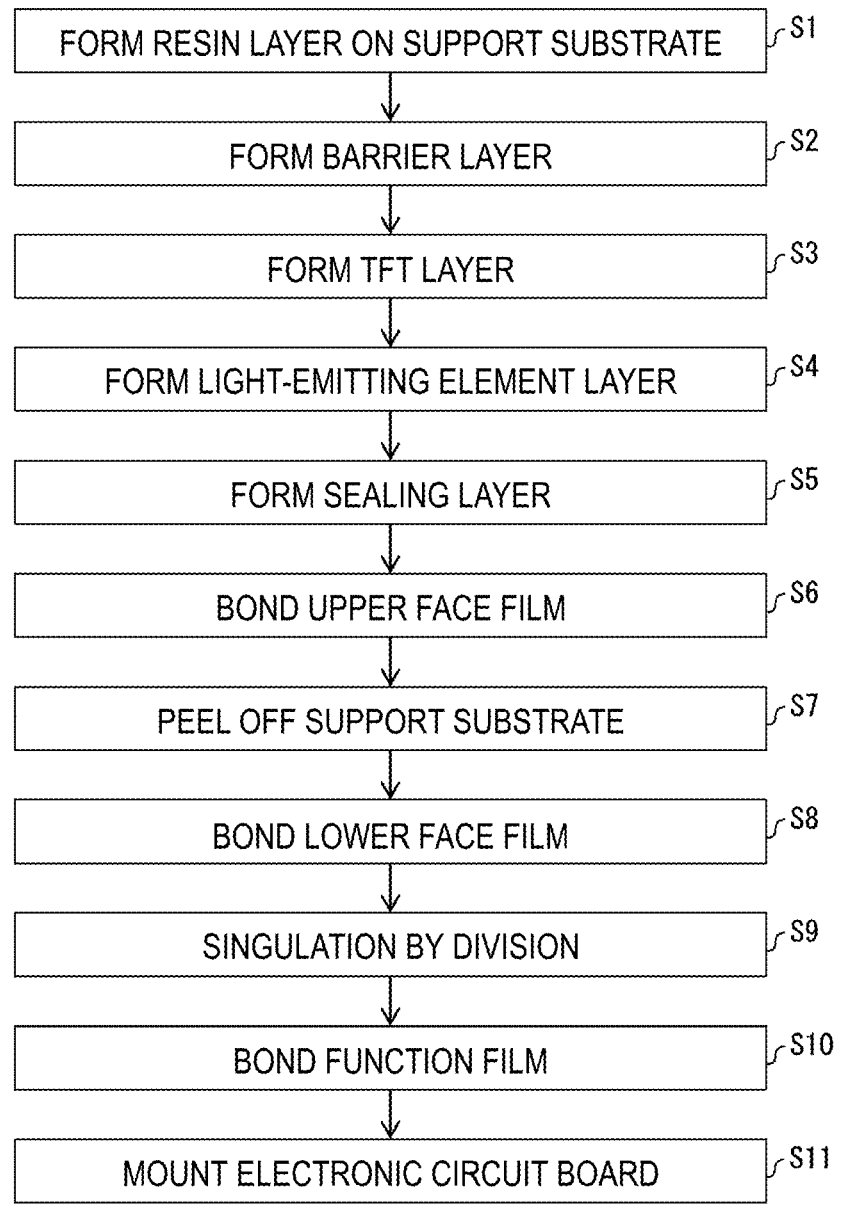
FIG. 1 is a flowchart illustrating an example of a manufacturing method of a display device.
Figure 2:
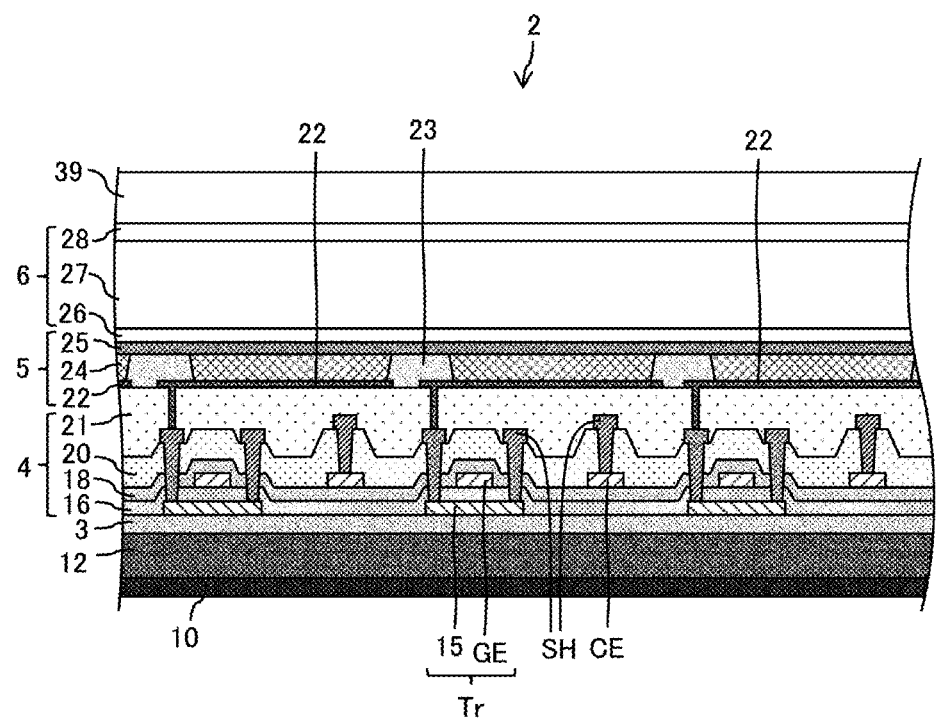
FIG. 2 is a cross-sectional view illustrating a configuration example of a display portion of the display device.

FIG. 1 is a flowchart illustrating an example of a manufacturing method of a display device 2. FIG. 2 is a cross-sectional view illustrating a configuration example of a display portion of the display device 2. In the explanation below, a "lower layer" refers to a layer formed in a process before the layer being compared, and an "upper layer" refers to a layer formed in a process after the layer being compared.

For example, when the display device 2, being a flexible display, is manufactured, first, a resin layer 12 is formed on a light-transmissive support substrate (for example, a mother glass substrate; not illustrated) as illustrated in FIG. 1 and FIG. 2 (S1). Next, a barrier layer 3 is formed (S2). Next, a thin film transistor (TFT) layer 4 is formed (S3). Next, a top-emitting type light-emitting element layer (for example, an organic light-emitting diode (OLED) layer) 5 is formed (S4). Next, a sealing layer 6 is formed (S5). Next, an upper face film is bonded on the sealing layer 6 (S6). Next, a lower face of the resin layer 12 is irradiated with a laser light over the support substrate to reduce a bonding force between the support substrate and the resin layer 12, and the support substrate is peeled from the resin layer 12 (S7). Next, a lower face film 10 is bonded to the lower face of the resin layer 12 (S8). Next, a layered body including the lower face film 10, the resin layer 12, the barrier layer 3, the TFT layer 4, the light-emitting element layer 5, and the sealing layer 6 is divided and a plurality of individual pieces are obtained (S9). Next, a function film 39 is bonded to the obtained individual pieces (S10). Next, an electronic circuit board (for example, an integrated circuit (IC) chip) is mounted on a terminal for external connection, and the display device 2 is achieved (S11). Note that each of the above-described steps is performed by a display device manufacturing apparatus.

Examples of the material of the resin layer 12 include a polyimide. Examples of the material used in the lower face film 10 include polyethylene terephthalate (PET).

The barrier layer 3 is a layer for preventing foreign matters such as water and oxygen from penetrating into the TFT layer 4 and the light-emitting element layer 5 during usage of the display device 2. The barrier layer 3 may include, for example, a silicon oxide ($SiO_x$) film, a silicon nitride film ($SiN_x$), a silicon oxynitride film ($SiO_xN_y$), or a layered film of these, formed using chemical vapor deposition (CVD).

The TFT layer 4 includes a semiconductor film 15, an inorganic insulating film 16 (a gate insulating film) as an upper layer of the semiconductor film 15, a gate electrode GE as an upper layer of the inorganic insulating film 16, an inorganic insulating film 18 as an upper layer of the gate electrode GE, a capacity wiring line CE as an upper layer of the inorganic insulating film 18, an inorganic insulating film 20 as an upper layer of the capacity wiring line CE, a source wiring line SH as an upper layer of the inorganic insulating film 20, and a flattening film 21 as an upper layer of the source wiring line SH.

A thin film transistor (TFT) Tr includes the semiconductor film 15, the inorganic insulating film 16 (the gate insulating film), and the gate electrode GE.

The semiconductor film 15 is made of a low-temperature polysilicon (LTPS) or an oxide semiconductor, for example. Note that FIG. 2 illustrates a case when the thin film transistor Tr provided with the semiconductor film 15 as a channel has a top gate structure. However, the thin film transistor Tr may have a bottom gate structure (for example, when the channel of the thin film transistor Tr is an oxide semiconductor).

The gate electrode GE, the capacitance electrode CE, and the source wiring line SH are each composed of a single layer film or a layered film of a metal, for example. The metal includes at least one of aluminum (Al), tungsten (W), molybdenum (Mo), tantalum (Ta), chromium (Cr), titanium (Ti), and copper (Cu), for example.

The inorganic insulating films 16, 18, and 20 may include a silicon oxide film, a silicon nitride film, or a layered film of these, formed using CVD. The flattening film (interlayer insulating film) 21 may include, for example, a coatable photosensitive organic material, such as a polyimide, an acrylic, or the like.

The light-emitting element layer 5 (for example, OLED layer) includes an anode (anode electrode) 22 as an upper layer of the flattering film 21, an anode cover film 23 configured to cover an edge of the anode 22, an electroluminescence (EL) layer 24 as an upper layer of the anode 22, and a cathode (cathode electrode) 25 as an upper layer of the EL layer 24. In the light-emitting element layer 5, (i) a light-emitting element (for example, OLED) including the anode 22 having an island shape, the EL layer 24 having an island shape, and the cathode (cathode electrode) 25, and (ii) a subpixel circuit configured to drive the light-emitting element are provided on a subpixel-by-subpixel basis.

The anode cover film 23 is an organic insulating film. The anode cover film 23 is formed by, for example, applying a photosensitive organic material (example: a polyimide, an acrylic, or the like), and then patterning the photosensitive organic material by photolithography.

The EL layer 24 is formed by, for example, layering a hole transport layer, a light-emitting layer, and an electron transport layer in this order from the lower layer side. The light-emitting layer is formed into an island shape on a subpixel-by-subpixel basis by vapor deposition or an ink-jet method. The hole transport layer and the electron transport layer may be formed into island shapes on a subpixel-by-subpixel basis. Or, the hole transport layer and the electron transport layer may be formed into solid-like shapes as a common layer of a plurality of subpixels.

The anode 22 is formed by, for example, the layering of indium tin oxide (ITO) and an alloy containing Ag. The anode 22 has light reflectivity. The cathode 25 may include a light-transmissive conductive material such as ITO and indium zinc oxide (IZO).

When the light-emitting element layer 5 is the OLED layer, positive holes and electrons are recombined inside the EL layer 24 by a drive current between the anode 22 and the cathode 25. Light is emitted as a result of excitons that are generated by the recombination falling into a ground state. In the display device 2, since the cathode 25 is light-transmissive and the anode 22 is light-reflective, the light emitted from the EL layer 24 travels upwards. Thus, the display device 2 may be configured as a top-emitting type device.

The sealing layer 6 includes an inorganic sealing film 26 as an upper layer of the cathode 25, an organic sealing film 27 as an upper layer of the inorganic sealing film 26, and an inorganic sealing film 28 as an upper layer of the organic sealing film 27. The sealing layer 6 prevents foreign matters (examples: water, oxygen, and the like) from penetrating into an interior of the light-emitting element layer 5. The inorganic sealing films 26 and 28 may be made of a silicon oxide film, a silicon nitride film, a silicon oxynitride film, or a layered film of these, formed by CVD, for example. The organic sealing film 27 may be made of a coatable photo-sensitive organic material (example: a polyimide, an acrylic, or the like) on an upper face of the inorganic sealing film 26.

The lower face film 10 is bonded to the lower face of the resin layer 12 after the support substrate has been peeled off. With the lower face film 10, the display device 2 having excellent flexibility can be achieved. Examples of the material used in the lower face film 10 include PET. The function film 39 includes a predetermined function (examples: an optical compensation function, a touch sensor function, a protection function, or the like).

The above has described a case where the display device 2 is manufactured as a flexible display. However, when the display device 2 is manufactured as a non-flexible display, replacement of the support substrate or the like is not required. Thus, for example, the flow transitions from S5 to S10 in FIG. 1.

Figure 3:
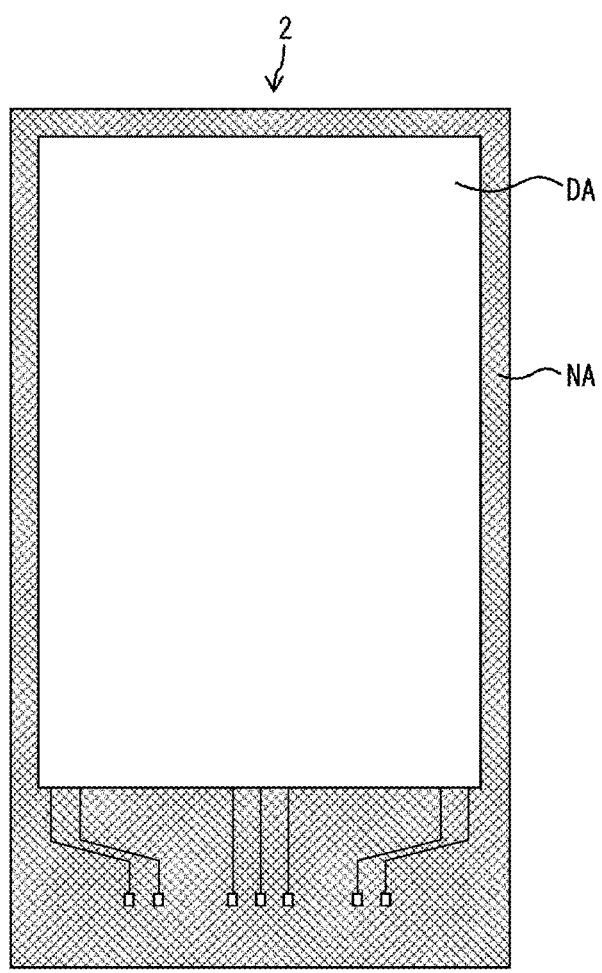
FIG. 3 is a diagram schematically illustrating the display device.

FIG. 3 is a diagram schematically illustrating the display device 2. The display device 2 is provided with a display region DA (active region) and a non-display region NA (non-active area). The display region DA is connectable to the above-described electronic circuit board (example: IC chip) via a terminal for external connection. The display region DA is driven by the electronic circuit board, making it possible to display a desired image in the active region DA. The non-display region NA is a frame region provided so as to surround the display region DA.

Vapor Deposition Step

In S4 described above, the light-emitting element layer 5 may be formed using a vapor deposition mask 220 (refer to FIG. 5 described later). The following illustrates a case where S4 is a step (vapor deposition step) for forming the light-emitting element layer 5 by vapor deposition.

Figure 4:
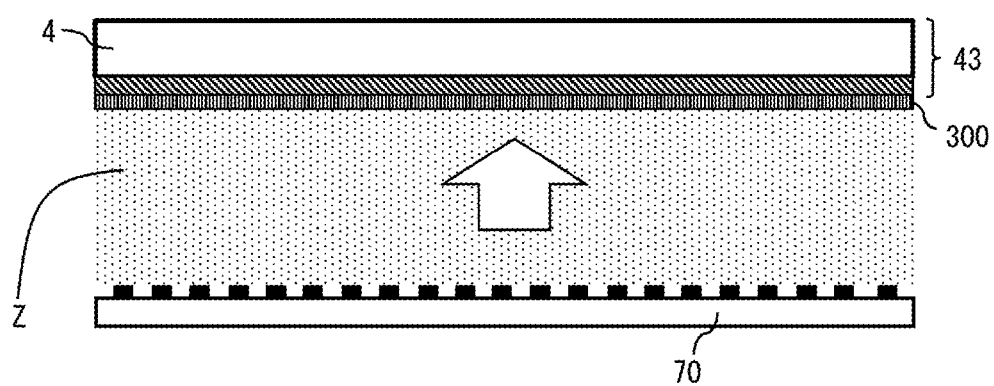
FIG. 4 is a diagram for explaining a vapor deposition step.

FIG. 4 is a diagram for explaining a vapor deposition step. In the vapor deposition step, the vapor deposition mask 220 including a mask sheet 300 (mask) provided with a plurality of openings 304 (example: refer to FIG. 7H described later) is closely adhered to a TFT substrate 43 including the TFT layer 4. The opening 304 is also referred to as a through-hole or a vapor deposition hole. Furthermore, the vapor deposition mask 220 is also referred to as a metal mask.

Next, particles Z (for example, an organic light-emitting material) vaporized or sublimated by a vapor deposition source 70 are vapor-deposited onto the TFT substrate 43 over the mask sheet 300. Thus, a vapor deposition pattern is formed in a pattern corresponding to the openings of the mask sheet 300.

Note that, in FIG. 4, a lower face of the mask sheet 300 is a face on a side facing the vapor deposition source 70, and an upper face of the mask sheet 300 is a face on a side facing the TFT substrate 43.

Vapor Deposition Mask

Figure 5:
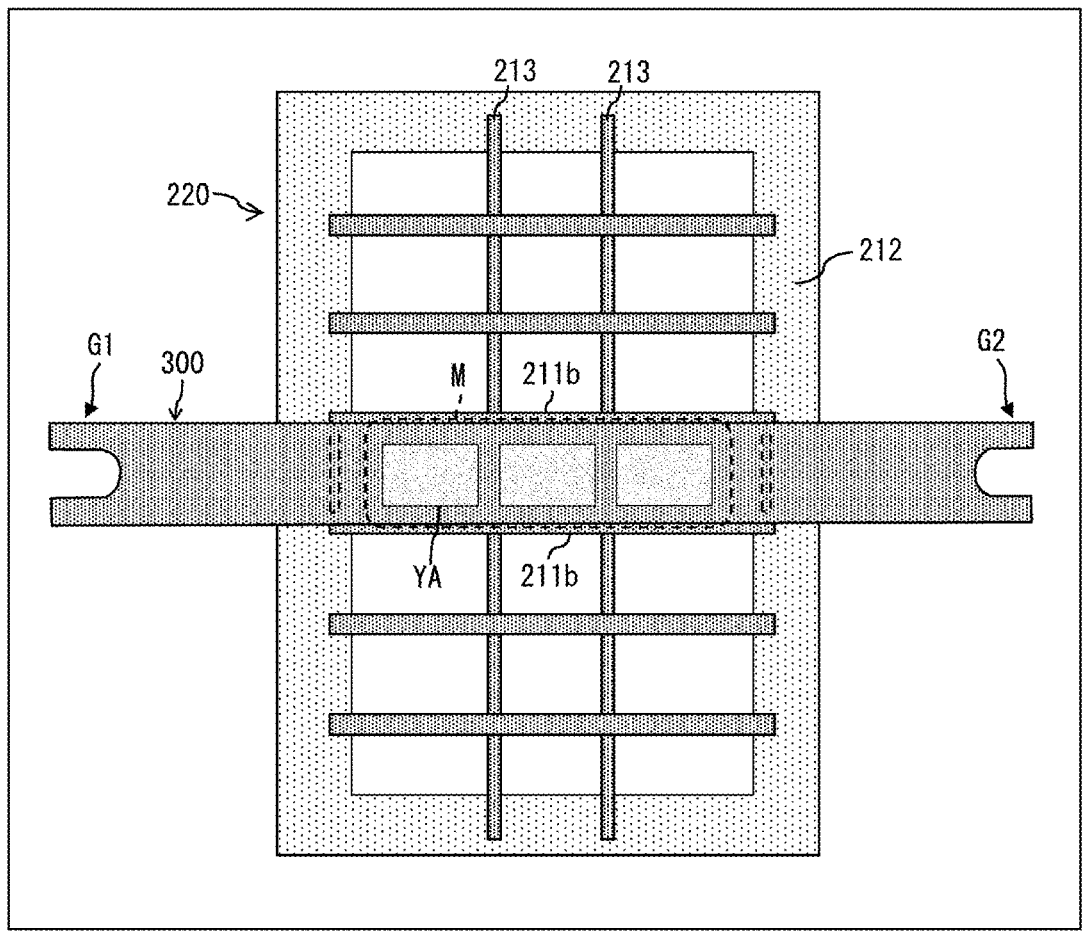
FIG. 5 is a plan view of a vapor deposition mask including a mask sheet.

FIG. 5 is a plan view of the vapor deposition mask 220 including the mask sheet 300. The vapor deposition mask 220 includes (i) a frame 212 (frame body), (ii) a plurality of support sheets 213 stretched across the frame 212 in a vertical direction (a width direction of the mask sheet 300), (iii) a plurality of cover sheets 211b stretched across the frame 212 in a horizontal direction (longitudinal direction of the mask sheet 300), and (iv) a plurality of the mask sheets 300.

In FIG. 5, only one mask sheet 300 is illustrated for ease of explanation. However, in actually, the mask sheet 300 is provided in a quantity equivalent to a number of rows of panels to be arranged. Note that YA in FIG. 5 denotes a valid portion of the mask sheet 300. The plurality of openings 304 are formed in the valid portion YA of the mask sheet 300. The mask sheet 300 includes two grippable side end portions G1 and G2, and an intermediate portion M.

The mask sheet 300 is aligned with the frame 212. Specifically, the mask sheet 300 is aligned so that a position of the openings 304 in the valid portion YA aligns with a pixel area (light-emitting area) of the TFT substrate 43. The valid portions YA each correspond to a single display region DA of the display device 2 (example: OLED panel).

That is, the particles Z emitted from the vapor deposition source 70 are vapor-deposited onto the display region DA through the openings 304. An edge portion of the mask sheet 300 overlaps with the non-display region NA. The particles Z are blocked by the edge portion, and do not reach the non-display region NA.

First Embodiment

The manufacturing method of the mask sheet 300 according to the present embodiment, which is used when the particles Z are vapor-deposited onto the display device 2 during manufacture, will now be described with reference to FIG. 6A to FIG. 10B.

Direct Current Electrolysis and Pulse Electrolysis

Figure 6A:
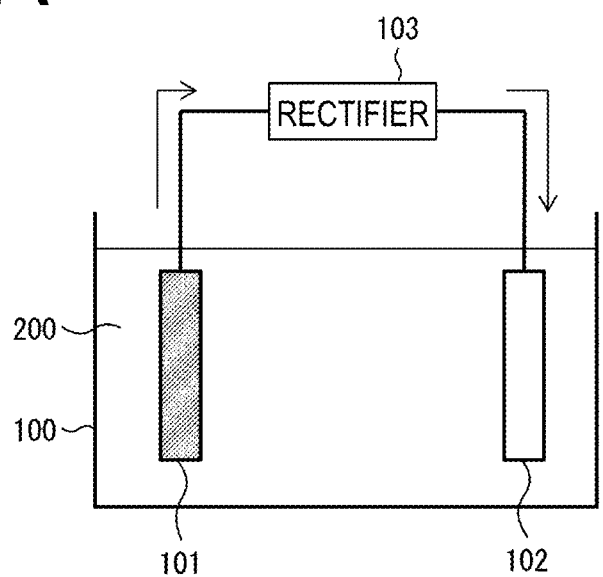
FIGS. 6A and 6B are diagrams for explaining pulse electrolysis, FIG. 6A illustrating a state when a forward current is flowing, and FIG. 6B illustrating a state when a reverse current is flowing.
Figure 6B:
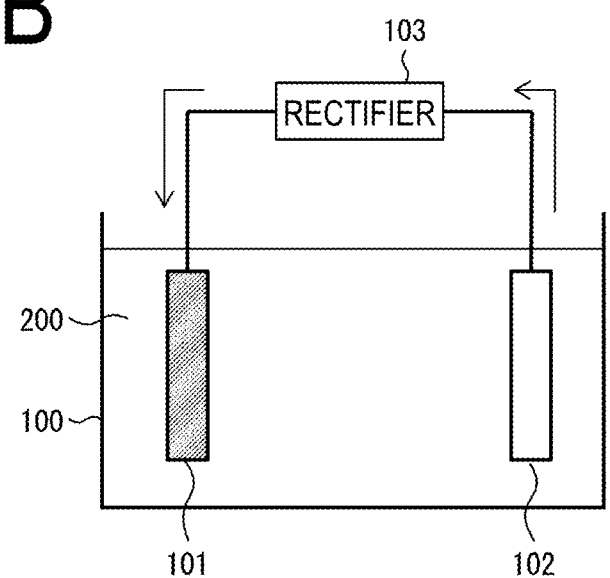

First, the pulse electrolysis used in the manufacturing method of the mask sheet 300 will be described. FIGS. 6A and 6B are diagrams for explaining pulse electrolysis, FIG. 6A illustrating a state when a forward current is flowing, and FIG. 6B illustrating a state when a reverse current is flowing.

Examples of the plating method described above include direct current electrolysis and pulse electrolysis. Direct current electrolysis is a method for forming a metal layer (forming a metal film) on a substrate by establishing a substrate to be plated (deposition target) as a cathode electrode, and introducing electric current from an anode electrode to the cathode electrode. That is, in direct current electrolysis, the direction in which the current flows is constant, and the substrate to be plated functions as the cathode electrode.

On the other hand, pulse electrolysis is, for example, a pulse plating method for forming a metal layer on a substrate by repeatedly applying (on-time) and stopping (off-time) current, or a periodic reverse (PR) plating method for forming a metal layer on a substrate by periodically changing the direction in which the current flows. This pulse electrolysis is, for example, applied to a technology in which a through-hole such as a through silicon via (TSV) is filled with copper. Note that, in the following, descriptions are made with the PR plating method as the method of pulse electrolysis, using FIGS. 6A and 6B.

As illustrated in FIGS. 6A and 6B, in pulse electrolysis, the substrate to be plated is immersed as a first electrode 101 into a solution 200 in a vessel 100 and, for example, a metal plate such as plate made of stainless steel (steel use stainless; SUS), nickel (Ni), or iron (Fe) is immersed as a second electrode 102. The first electrode 101 and the second electrode 102 are connected to a rectifier 103 capable of changing a current density. Furthermore, the rectifier 103 is capable of changing a positive/negative state of the current density. That is, the rectifier 103 is capable of changing (switching) the direction in which the current flows. Note that the current density (current value per unit surface area) of the current applied by the rectifier 103 is also referred to as an average current density.

As illustrated in FIG. 6A, the rectifier 103 causes the current to flow in a direction from the rectifier 103 to the second electrode 102 by applying a positive current. That is, at this time, the first electrode 101 functions as a cathode electrode, and the second electrode 102 functions as an anode electrode. Furthermore, in the solution 200, current flows from the second electrode 102 to the first electrode 101. The current flowing at this time is referred to as a positive current or a forward current.

On the other hand, as illustrated in FIG. 6B, the rectifier 103 causes the current to flow in a direction from the rectifier 103 to the first electrode 101 by applying a negative current. That is, at this time, the first electrode 101 functions as an anode electrode, and the second electrode 102 functions as a cathode electrode. Furthermore, in the solution 200, current flows from the first electrode 101 to the second electrode 102. The current flowing at this time is referred to as a negative current or a reverse current.

Thus, with pulse electrolysis, the substrate to be plated can be switched to a cathode electrode or an anode electrode by switching the forward current and the reverse current (that is, switching the direction in which the current flows). Specifically, when the substrate functions as a cathode electrode, the metal in the solution 200 is deposited onto the substrate, and when the substrate functions as an anode electrode, the metal deposited onto the substrate is dissolved. Thus, with pulse electrolysis, the metal layer is deposited onto the substrate by repeatedly depositing and dissolving the metal on the substrate.

Manufacturing Method of Mask

In the manufacturing method of the mask sheet 300 of the present embodiment, pulse electrolysis is used in addition to direct current electrolysis. In at least the direct current electrolysis, a mask substrate 301 (mask substrate 301 for forming metal layers 302a and 302b) for manufacturing the mask sheet 300 to be plated is made to function as a cathode electrode. The metal layer 302a is repeatedly deposited and dissolved on the mask substrate 301 on which the metal layer 302a was formed using direct current electrolysis, by further using pulse electrolysis. Note that, in the present embodiment, descriptions are made with the PR plating method as the method of pulse electrolysis.

Figure 9A:
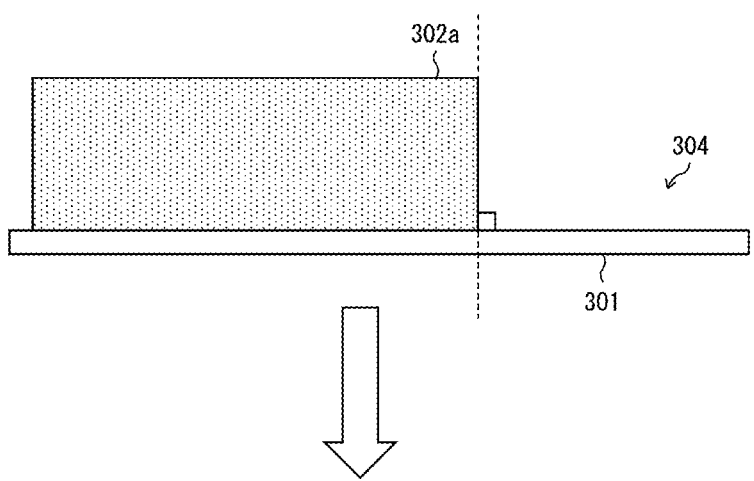
FIGS. 9A and 9B are diagrams for explaining formation principles of the metal layer, FIG. 9A being a diagram illustrating the metal layer before an opening is formed into a tapered shape, and FIG. 9B being a diagram illustrating the metal layer after the opening is formed into a tapered shape.
Figure 9B:
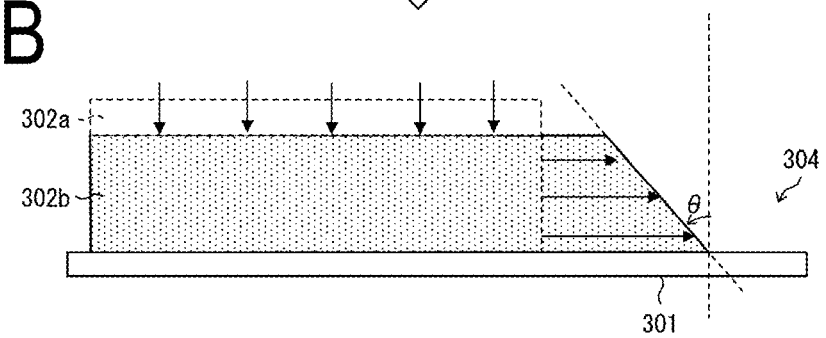

In the following, a specific example of the manufacturing method of the mask sheet 300 will be described using FIG. 7A to FIG. 9B. FIGS. 7A to 7H are diagrams illustrating an example of the manufacturing method of the mask sheet 300 according to the present embodiment. FIG. 8A is a diagram illustrating an example of changes over time in a current density when the metal layer 302a is formed using direct current electrolysis, and FIG. 8B is a diagram illustrating an example of changes over time in a current density when the metal layer 302b is formed using pulse electrolysis. FIGS. 9A and 9B are diagrams for explaining formation principles of the metal layer 302b, FIG. 9A being a diagram illustrating the metal layer 302a, and FIG. 9B being a diagram illustrating the metal layer 302b.

Figure 7A:
FIGS. 7A to 7H are diagrams illustrating an example of the manufacturing method of a mask sheet according to a first embodiment.
Figure 7B:

The mask substrate 301 is prepared for manufacturing the mask sheet 300 as illustrated in FIG. 7A, and the metal layer 302 functioning as an underlayer is formed on the mask substrate 301 as illustrated in FIG. 7B. The metal layer 302 is, for example, made of nickel, and is formed using electroless plating or sputtering. When the metal layer 302 is formed using electroless plating, a thickness of the metal layer 302 is, for example, from 2 to 3 μm. When the metal layer 302 is formed using sputtering, the thickness of the metal layer 302 is, for example, from 0.3 to 1 μm.

Figure 7C:
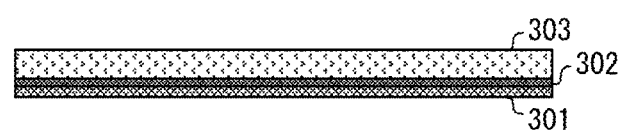

Next, as illustrated in FIG. 7C, a resist layer 303 for patterning the plurality of openings 304 in a subsequent step is formed on the metal layer 302. The resist layer 303 is made by, for example, applying a photosensitive organic material (photoresist) onto the metal layer 302.

Figure 7D:
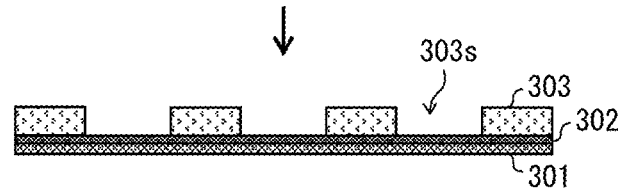

After formation of the resist layer 303, a space 303s (space portion) for forming the metal layer 302a (ultimately, the metal layer 302b) included in the mask sheet 300 is formed in the resist layer 303, as illustrated in FIG. 7D.

The space 303s is formed using, for example, photolithography. That is, to form the space 303s in the resist layer 303 (in other words, to form the plurality of openings 304 having a predetermined pattern), a portion (portion where the space 303s is to be formed) of the resist layer 303 other than the predetermined pattern is irradiated (exposed) with light or an electron beam to change a solubility of the portion, and the resist layer 303 after exposure is developed. As a result, the resist of the portion is removed, and the space 303s is formed in the portion.

That is, at least the two steps illustrated in FIGS. 7C and 7D are resist layer formation steps for forming the resist layer 303 including a plurality of the spaces 303s on the mask substrate 301.

Figure 7E:
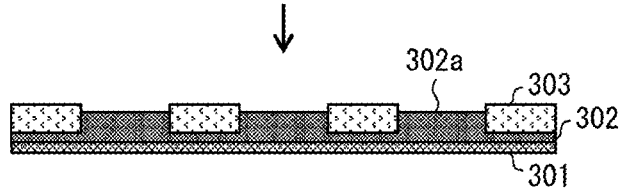

Next, as illustrated in FIG. 7E, the metal layer 302a (electroplating film) is formed in the space 303s using direct current electrolysis. Specifically, as illustrated in FIG. 6A, the mask substrate 301 including the resist layer 303 in which the space 303s was formed (refer to FIG. 7D) is immersed as a cathode electrode (here, the first electrode 101) in the solution 200. Furthermore, a metal plate of stainless steel, nickel, iron, or the like, for example, is immersed as an anode electrode (here, the second electrode 102) in the solution 200. However, instead of the rectifier 103, a rectifier for introducing direct current to the anode electrode side is connected. Then, direct current is applied, forming the metal layer 302a on the mask substrate 301 (specifically, on the metal layer 302 of the space 303s) functioning as a cathode electrode.

The metal layer 302a is made of the same type of metal as the metal layer 302. In the present embodiment, to form the metal layer 302a on the mask substrate 301, an iron-nickel alloy plating solution (a plating solution that includes iron in a plating solution that includes nickel (nickel plating solution)) is used, for example, as the solution 200. This iron-nickel alloy plating solution is a solution having a pH of from 2.3 to 3.5, inclusive, for example. Furthermore, a temperature when the metal layer 302a is formed by direct current electrolysis is, for example, 50° C. Furthermore, compositions of the iron-nickel alloy plating solution, and an example of a molar concentration of each composition are as follows.

Nickel sulfate hexahydrate ($NiSO_4$ $6H_2O$): from 0.90 mol/L to 1.50 mol/L, inclusive Nickel chloride hexahydrate ($NiCl_2$ $6H_2O$): from 0.15 mol/L to 0.25 mol/L, inclusive Boric acid ($H_3BO_3$): from 0.45 mol/L to 0.60 mol/L, inclusive Iron sulfate heptahydrate ($FeSO_4$ $7H_2O$): from 0.30 mol/L to 0.60 mol/L, inclusive Sodium saccharinate dihydrate ($C_7H_4NNaO_3S$ $2H_2O$): from 0.005 mol/to 0.02 mol/L, inclusive Citric acid, tartaric acid, glycolic acid, gluconic acid, malic acid, or malonic acid: from 0.05 mol/L to 0.012 mol/L, inclusive Note that sodium saccharinate as well as about the same amount of naphthalenedisulfonic acid sodium can be used as a brightening agent in a surface conditioner. Furthermore, to level a front face of the metal layer 302a, butanediol or propargyl alcohol may be added and level adjustment carried out.

Furthermore, the solution 200 is not limited to the iron-nickel alloy plating solution, and may be, for example, a nickel plating solution or a cobalt (CO)-nickel alloy plating solution (a plating solution obtained by adding cobalt to a nickel plating solution).

Furthermore, the current density when the metal layer 302a is formed using direct current electrolysis is constant, as illustrated in FIG. 8A. In the present embodiment, the current density is set to from 2.0 $A/dm^2$ to 4.0 $A/dm^2$, inclusive. FIG. 8A illustrates an example in which the current density is set to 2.0 $A/dm^2$.

A thickness of the portion of the metal layer 302a that is formed using direct current electrolysis (a thickness of the portion that does not include the metal layer 302 formed in FIG. 7B) is, for example, from 10 μm to 40 μm, inclusive. That is, the overall thickness of the metal layer 302a is from 12 µm to 43 µm, inclusive, when the metal layer 302 is formed by using electroless plating, and from 10.3 µm to 41 µm, inclusive, when the metal layer 302 is formed by using sputtering.

Figure 7F:
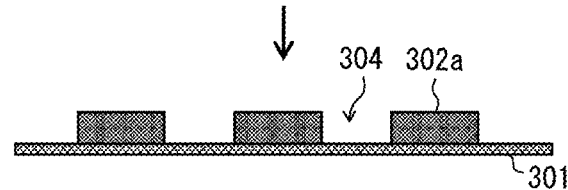

After the metal layer 302a is formed to the thickness described above, the mask substrate 301 on which the metal layer 302a is formed is removed from the solution 200. Then, as illustrated in FIG. 7F, the resist layer 303 on the metal layer 302, and the metal layer 302 in a position facing the resist layer 303 (the metal layer 302 on which the resist layer 303 is formed) are removed by, for example, an etching process. As a result, the plurality of openings 304 are formed.

That is, at least the two steps illustrated in FIGS. 7E and 7F are film formation steps for forming the metal layer 302a including the plurality of openings 304 on the mask substrate 301. Specifically, this film formation step includes at least the two steps of forming the metal layer 302a on the mask substrate 301 (refer to FIG. 7E), and removing the resist layer 303 and the metal layer 302 on which the resist layer 303 is formed (refer to FIG. 7F).

At this time, when the mask substrate 301 is peeled from the metal layer 302a, a mask sheet 1000 (refer to FIG. 10A described later) serving as a comparative example is manufactured. This mask sheet 1000 includes the metal layer 302a provided with the plurality of openings 304 not formed into tapered shapes. In the present embodiment, the metal layer 302a further passes through a shaping step for shaping the metal layer 302a into the metal layer 302b using pulse electrolysis, thereby manufacturing the mask sheet 300 including the metal layer 302b provided with the plurality of openings 304 formed into tapered shapes, as illustrated in FIG. 7G.

Specifically, as illustrated in FIG. 6A, the mask substrate 301 on which the metal layer 302a including the plurality of openings 304 is formed (refer to FIG. 7F) is immersed as the first electrode 101 in the solution 200. That is, the metal layer 302a to be shaped in the shaping step is the first electrode 101. Further a metal plate of stainless steel, nickel, iron, or the like, for example, is immersed as the second electrode 102 in the solution 200. The rectifier 103 is connected to the first electrode 101 and the second electrode 102. As the solution 200, the solution described above used when the metal layer 302a was formed by direct current electrolysis can be used. Furthermore, a temperature of the solution 200 when the metal layer 302b is formed by pulse electrolysis is, for example, 50° C.

The rectifier 103, as illustrated in FIG. 8B, switches the forward current and reverse current over time (periodically). Accordingly, in the shaping step, the metal layer 302a is repeatedly deposited and dissolved on the mask substrate 301 as the first electrode 101.

Figure 7G:
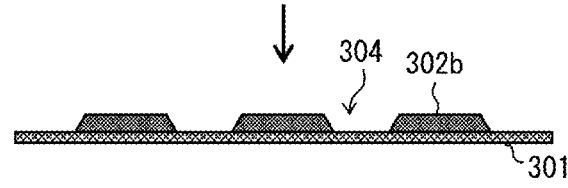

As a result, the metal layer 302a that includes the openings 304 that are not tapered (θ=0°) and is illustrated in FIG. 7F and FIG. 9A is shaped into the metal layer 302b including the openings 304 formed into tapered shapes (θ>0°), as illustrated in FIG. 7G and FIG. 9B. In other words, as illustrated in FIGS. 9A and 9B, the metal layer 302a is shaped into the metal layer 302b so that an angle (taper angle) formed on the opening 304 side by the mask substrate 301 and a side surface (wall face) of the metal layer 302a or the metal layer 302b changes from substantially orthogonal to an obtuse angle.

Note that the first electrode 101 may also be referred to as an electrode on the side where the metal layer 302a is shaped in the shaping step. Furthermore, the formed angle described above can also be referred to as the angle formed on the opening 304 side by the TFT substrate 43 (refer to FIG. 10B) and the side surface described above.

When pulse electrolysis is used, the first electrode 101 functions as a cathode electrode in the same way as direct current electrolysis when a forward current flows. As a result, the metal layer 302a grows in a direction away from the mask substrate 301 (to the facing electrode (second electrode 102) side).

When a reverse current flows, the first electrode 101 functions as an anode electrode. As a result, as illustrated in FIG. 9B, in the metal layer 302a, the current density increases as a distance from the mask substrate 301 increases (that is, as a distance from the facing electrode (second electrode 102) decreases), advancing the dissolving of the metal layer 302a with higher priority. As a result, the thickness of the metal layer 302a decreases. On the other hand, in the metal layer 302a, the current density decreases as a distance from the mask substrate 301 (as a distance from the facing electrode (second electrode 102) increases), making the dissolving of the metal layer 302a less likely, even when the metal layer 302a switches to an anode electrode, and thus deposition of the metal layer continues. As a result, in the metal layer 302a, the area away from the facing front face side is elongated along a front face of the mask substrate 301. As a result, the metal layer 302b including the openings 304 formed into tapered shapes is formed.

Thus, the directions of growth of the metal layer 302a differ depending on whether a forward current or a reverse current is applied. Specifically, the opening 304 can be formed into a tapered shape by making the current density of the reverse current greater than the current density of the forward current.

In this case, in locations where lines of electric force readily concentrate in the metal layer 302a (on the side close to the facing electrode, that is, in locations where current density is high), dissolving takes priority over deposition. Furthermore, on the side surface side of the metal layer 302a, the metal layer 302a hardly dissolves in locations where the lines of electric force hardly concentrate (on the side away from the facing electrode, that is, in locations where current density is low). That is, on the side surface of the metal layer 302a, the deposited metal layer is less likely to dissolve as the distance from the facing electrode increases (as the distance to the mask substrate 301 side decreases), and thus film formation in the side surface direction continues by repeated application of a forward current and a reverse current.

In the present embodiment, the current density of the reverse current, for example, is set to from two times to eight times, inclusive, the current density of the forward current. That is, (Current density of forward current):(Current density of reverse current) is set to from 1:2 to 1:8, inclusive.

Furthermore, given a forward time as time when the forward current is flowing and a reverse time as a time when the reverse current is flowing, the reverse time is preferably set shorter than the forward time. For example, the reverse time is set to from 1/20 to 1/10, inclusive, of the forward time. For example, when the forward time per application is set to 80 ms, the reverse time per application is set to from 4 ms to 8 ms, inclusive.

Consider a case where the forward time and the reverse time are set to 4 ms and 80 ms, respectively, under conditions in which the current densities of the forward current and the reverse current are the same as when the forward time and the reverse time are set as described above. In this case, the dissolved amount even on the side surface side of the metal layer 302 (particularly, the side close to the mask substrate 301) increases, causing the deposited amount of the metal to be insufficient, and a taper not to form on the side surface side. As a result, to suppress film formation on the side close to the facing electrode (the side having a high current density) and continue deposition of the metal on the side away from the facing electrode (the side having a low current density), it is preferable to set the forward time longer than the reverse time.

In the example in FIG. 8B, the current density of the forward current and the current density of the reverse current are set to +2 A/dm$^2$ and −12 A/dm$^2$, respectively (the current density of the forward current and the current density of the reverse current are expressed as positive and negative, respectively). That is, in this example, (Current density of forward current):(Current density of reverse current) is set to 1:6. When the current density of the forward current is set to +2 A/dm$^2$, the current density of the reverse current is preferably adjusted within a range of from −4 A/dm$^2$ to −16 A/dm$^2$, inclusive. Furthermore, in the example in FIG. 8B, when the forward time per application is set to 80 ms, the reverse time per application is set to 4 ms, inclusive.

Note that the formed angle described above is sufficient as long as the particles Z are vapor-deposited substantially uniformly onto the TFT substrate 43 via the openings 304. Furthermore, a degree of deformation of the metal layer 302a is sufficient as long as the formed angle is satisfied and the metal layer 302b does not block the openings 304 (the function of the mask sheet 300 is not lost).

To achieve such formation of the openings 304, various conditions are set in the shaping step using pulse electrolysis. Examples of the various conditions include (1) the composition, pH, or temperature of the solution 200, (2) the above-described ratio of the forward current to the reverse current, (3) the above-described ratio of the forward time to the reverse time, (4) the total processing time of the shaping step. Based on this condition setting, a level of decrease from the thickness of the metal layer 302a to the thickness of the metal layer 302b (a decrease rate of the thickness of the metal layer 302a), a growth rate of the metal layer 302a to the side surface side (example: a maximum growth rate of the metal layer 302a on the bottom face side), and the like are determined. That is, such a formed angle and degree of deformation of the metal layer 302 as described above are achieved, and thus the openings 304 are formed into tapered shapes.

Figure 7H:
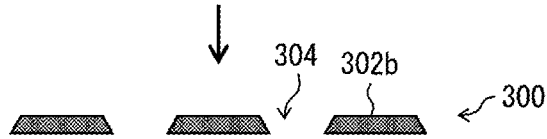

After the metal layer 302b is formed in the shaping step, the mask substrate 301 is peeled from the metal layer 302b, thereby completing the mask sheet 300 including the metal layer 302b provided with the plurality of openings 304, as illustrated in FIG. 7H.

Advantageous Effects

Figure 10A:
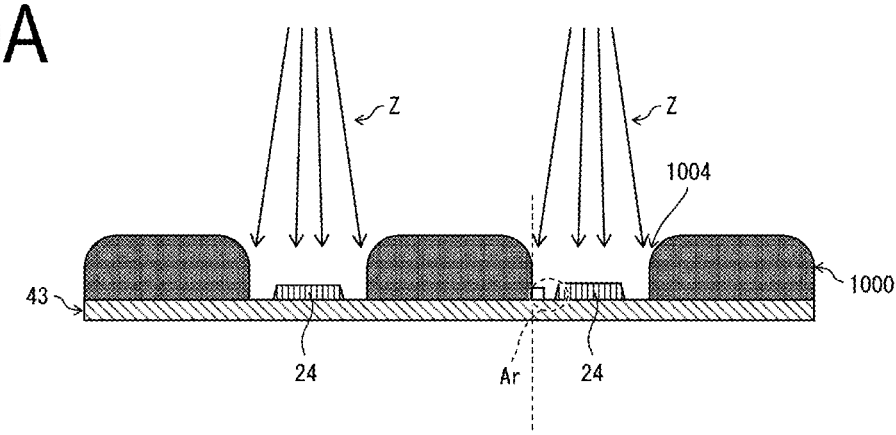
FIGS. 10A and 10B are a diagram illustrating an example of a state when particles are vapor-deposited onto a TFT substrate using a mask sheet of a comparative example, and a diagram illustrating an example of a state when particles are vapor-deposited onto a TFT substrate using the mask sheet of the first embodiment, respectively.
Figure 10B:
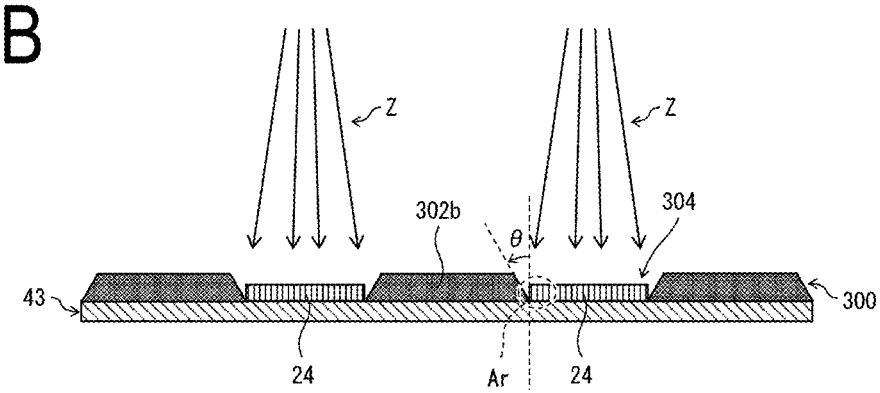

The advantageous effects of the manufacturing method of the mask sheet 300 will be described using FIGS. 10A and 10B. FIG. 10A is a diagram illustrating an example of a state when the particles Z are vapor-deposited onto the TFT substrate 43 using the mask sheet 1000 of the comparative example. FIG. 10B is a diagram illustrating an example of a state when the particles Z are vapor-deposited onto the TFT substrate 43 using the mask sheet 300 of the present embodiment. Here, the mask sheet 1000 illustrated in FIG. 10A is described as a mask sheet in which a plurality of openings 1004 are formed using only direct current electrolysis as the plating method.

As illustrated in FIG. 10A, when the mask sheet 1000 is aligned on the TFT substrate 43, an angle formed by the TFT substrate 43 and a side surface of the mask sheet 1000 that forms the opening 1004 is substantially orthogonal. That is, when the openings 1004 are formed using only direct current electrolysis, it is difficult to form the openings 1004 into tapered shapes.

As illustrated in FIG. 10A, the particles Z from a crucible (not illustrated) are vapor-deposited onto the TFT substrate 43 via the openings 1004, and thus the EL layer 24 is formed on the TFT substrate 43. At this time, a direction of vapor deposition of the particles Z is not limited to substantially orthogonal to the TFT substrate 43. As a result, when the formed angle described above is substantially orthogonal, the possibility exists that vapor deposition of the particles Z onto a region Ar of the TFT substrate 43 near the side surface will be obstructed by the side surface of the mask sheet 1000.

In particular, under present circumstances where miniaturization of the subpixels (pixel area) has advanced, the demand for miniaturization of the openings 1004 is high. Accordingly, the openings 1004 cannot be sufficiently enlarged with respect to the region where the particles Z are to be vapor-deposited onto the TFT substrate 43 (that is, the region where the EL layer 24 having an island shape is to be formed). Therefore, when the formed angle described above is substantially orthogonal, vapor deposition of the particles Z onto the region Ar is obstructed, and a cross-sectional shape of the EL layer 24 having an island shape readily becomes substantially trapezoidal. Note that the region in the shadow of the side surface described above where vapor deposition is blocked is also referred to as a mask shadow.

As a result of the vapor deposition of the particles Z onto the region Ar being obstructed as described above, the thickness of the EL layer 24 having an island shape differs at a center portion and a peripheral portion in the subpixels corresponding to the openings 1004. Specifically, the peripheral portion of the EL layer 24 having an island shape becomes thinner than the center portion, and the particles Z are not vapor-deposited in the peripheral portion as illustrated in FIG. 10A, causing the EL layer 24 having an island shape to be formed with a smaller surface area than desired. As a result, in the mask sheet 1000, defects such as color unevenness occur between the center portion and the peripheral portion of the subpixels during light emission of the EL layer 24.

On the other hand, in the manufacturing method of the mask sheet 300 of the present embodiment, the metal layer 302b provided with the openings 304 formed into tapered shapes (θ>0°) as illustrated in FIG. 10B can be formed by shaping the metal layer 302a using pulse electrolysis in the shaping step. In particular, the openings 304 can be formed into tapered shapes by adjusting the current densities and application times of the forward current and the reverse current as described above (example: by making the current density of the reverse current greater than the current density of the forward current).

As a result, the particles Z can also be vapor-deposited in the region Ar, which can become a mask shadow, making it possible to vapor-deposit the particles Z onto the TFT substrate 43 substantially uniformly. Thus, the EL layer 24 can be formed so that the thickness of the EL layer 24 is substantially uniform in the center portion and the peripheral portion. That is, the EL layer 24 can be formed with favorable precision. As a result, the occurrence of defects such as color unevenness described above can be avoided during light emission by the EL layer 24.

Other

The mask sheet 300 is manufactured using a manufacturing method including at least a film formation step and a shaping step. Specifically, the mask sheet 300 includes the metal layer 302b provided with the plurality of openings 304 having tapered shapes.

Furthermore, the manufacturing method of the display device 2 includes a vapor deposition step for vapor-depositing the particles Z onto the TFT substrate 43 using the mask sheet 300 manufactured by the manufacturing method described above (the mask sheet 300 including the metal layer 302b).

Thus, the particles Z can be vapor-deposited onto the TFT substrate 43 with favorable precision by using the mask sheet 300 in the vapor deposition step. As a result, the display device 2 including the EL layer 24 having a substantially uniform thickness can be manufactured. That is, the display device 2 excluding the above-described defects can be manufactured.

Note that, while the steps illustrated in FIGS. 7A to 7H are described as the manufacturing method of the mask sheet 300, the manufacturing method is not limited thereto. When the vapor deposition mask 220 is not manufactured with the plurality of mask sheets 300 arranged in parallel, the vapor deposition mask 220 may be manufactured via the steps illustrated in FIGS. 7A to 7H.

Furthermore, while the PR plating method is used for the pulse electrolysis in the shaping step illustrated in FIG. 7G, the method is not limited thereto, and a pulse plating method may be used, for example. In this case, instead of the rectifier 103, a rectifier that turns on and off a direct current per predetermined time period is used.

Second Embodiment

A description follows regarding another embodiment of the disclosure, with reference to FIGS. 11A to 11K. Note that members having the same function as the members stated in the embodiment above are appended with the same reference signs for the sake of description, and the description thereof is omitted.

In the first embodiment, as illustrated in FIG. 7G, the metal layer 302a is shaped into the metal layer 302b using pulse electrolysis in the shaping step. In the first embodiment, the various conditions described above are set so that the openings 304 are not blocked and are formed into tapered shapes. However, a slight possibility also exists that the growth of the side surface of the metal layer 302a may excessively advance for some reason, causing the openings 304 formed in FIG. 7F to be blocked by the metal layer 302b. To avoid such a possibility, in the manufacturing method of the mask sheet 300 of the present embodiment, a suppressing portion formation step for forming a suppressing portion described later is added to the manufacturing method of the first embodiment.

In the following, a specific example of the manufacturing method of the mask sheet 300 of the present embodiment will be described using FIGS. 11A to 11K. FIGS. 11A to 11H are diagrams illustrating an example of the manufacturing method of the mask sheet 300 according to the present embodiment.

The steps illustrated in FIGS. 11A to 11F are the steps through formation of the metal layer 302a provided with the plurality of openings 304, and are the same as the steps illustrated in FIGS. 7A to 7F. After the plurality of openings 304 are formed in the metal layer 302a as illustrated in FIG. 11F (after the film formation step), a resist layer 305 is formed on the mask substrate 301 and the metal layer 302a, as illustrated in FIG. 11G. The resist layer 305 is made by, for example, applying a photosensitive organic material onto the mask substrate 301 and the metal layer 302a.

After formation of the resist layer 305, as illustrated in FIG. 11H, the resist in portions other than a predetermined region of each of the openings 304 is removed so that the resist layer 305 remains only in the predetermined region. This process is performed using, for example, photolithography. The predetermined region described above is a region corresponding to the subpixel of the display device 2 (example: a region including a center of the opening 304), and is large enough to include the size of the subpixel. The size of the predetermined region is, for example, the size of the portion of the openings 304 of the metal layer 302b of the first embodiment that is in contact with the mask substrate 301 (the portion in contact with the TFT substrate 43 in the vapor deposition step; refer to FIG. 7G).

The resist layer 305 (the resist layer 305 having an island shape) that remains in the predetermined region after the above-described process functions as a suppression portion that suppresses expansion of the metal layer 302a into the predetermined region in the shaping step, which is the subsequent step. That is, the step illustrated in FIG. 11H is a suppressing portion formation step for forming the resist layer 305 having an island shape as a suppressing portion onto the openings 304.

In a state when the resist layer 305 having an island shape remains in the openings 304, the metal layer 302a is shaped into the metal layer 302b using pulse electrolysis, similar to the first embodiment, as illustrated in FIG. 11I (shaping step). With the resist layer 305 having an island shape formed on the openings 304, even when the metal layer 302a grows excessively on the openings 304, the growth is suppressed by the resist layer 305 having an island shape. As a result, it is possible to reliably avoid blockage of the openings 304 by the metal layer 302b and loss of the function of the mask sheet 300.

After the metal layer 302b is formed in the shaping step, the resist layer 305 having an island shape and serving as the suppressing portion is removed as illustrated in FIG. 11J (removal step). Then, as illustrated in FIG. 11K, the mask substrate 301 is peeled from the metal layer 302b, thereby completing the mask sheet 300 including the metal layer 302b provided with the plurality of openings 304.

Supplement

A manufacturing method of a mask according to a first aspect of the disclosure is a manufacturing method of a mask (mask sheet 300) used when particles (Z) are vapor-deposited onto a display device (2) during manufacture, the manufacturing method including a film formation step for forming a metal layer (302a) including a plurality of openings (304) on a mask substrate (301), and a shaping step for shaping the metal layer using pulse electrolysis.

According to the configuration described above, a taper can be formed on each of the openings (the openings can be formed into tapered shapes). Thus, the particles can be vapor-deposited substantially uniformly onto a region where subpixels facing the openings are formed. As a result, a display device including subpixels without color unevenness or the like can be manufactured.

Furthermore, in the manufacturing method of a mask according to a second aspect of the disclosure, in the first aspect, of a first electrode (101) and a second electrode (102) used in the pulse electrolysis, the first electrode may be the metal layer to be shaped in the shaping step and, given a forward current as a current flowing from the second electrode to the first electrode and a reverse current as a current flowing from the first electrode to the second electrode, a current density of the reverse current may be greater than a current density of the forward current.

According to the configuration described above, the openings can be reliably formed into tapered shapes.

Furthermore, in the manufacturing method of a mask according to a third aspect of the disclosure, in the second aspect, given a forward time as a time when the forward current is flowing and a reverse time as a time when the reverse current is flowing, the reverse time may be shorter than the forward time.

According to the configuration described above, the openings can be reliably formed into tapered shapes.

Further, in the manufacturing method of a mask according to a fourth aspect of the disclosure, in any one of the first to third aspects, the manufacturing method may further include a resist layer formation step for forming a resist layer provided with a plurality of space portions on the mask substrate. In the film formation step, the metal layer including the plurality of openings may be formed by removing the resist layer after formation of a metal layer in the plurality of space portions.

According to the configuration described above, the plurality of openings can be formed in the metal layer using the resist layer.

Further, in the manufacturing method of a mask according to a fifth aspect of the disclosure, in the fourth aspect, the film formation step may form the metal layer in the plurality of space portions using direct current electrolysis.

According to the configuration described above, the metal layer can be formed using direct current electrolysis.

Further, in the manufacturing method of a mask according to a sixth aspect of the disclosure, in any one of the first to the fifth aspect, the shaping step may include a suppressing portion formation step for forming a suppressing portion (resist layer 305) configured to suppress expansion of the metal layer to inside a predetermined region of the plurality of openings formed in the film formation step in each of the plurality of openings, and a removal step for removing the suppressing portion formed in the suppressing portion formation step after the shaping step.

According to the configuration described above, it is possible to avoid excessive expansion of the metal layer on the mask substrate and blockage of the openings by the metal layer in the shaping step.

Further, in the manufacturing method of a mask according to a seventh aspect of the disclosure, in the sixth aspect, the suppressing portion formation step may form the suppressing portion in the predetermined region by removing portions of the resist layer other than the predetermined region after formation of the resist layer on the mask substrate and on the metal layer formed in the film formation step.

According to the configuration described above, the suppression portion can be formed in the predetermined region using the resist layer.

Additional Items

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 Display device
101 First electrode
102 Second electrode
300 Mask sheet (mask)
301 Mask substrate
302*a* Metal layer
304 Opening
305 Resist layer (suppressing portion)
Z Particles

The invention claimed is:

1. A manufacturing method of a mask used when particle are vapor-deposited onto a display device during manufacture, the manufacturing method comprising:
    a film formation step for forming a metal layer including a plurality of openings on a mask substrate; and
    a shaping step for shaping the metal layer using pulse electrolysis; wherein,
    of a first electrode and a second electrode used in the pulse electrolysis, the first electrode is the metal layer to be shaped in the shaping step, and
    given a forward current as a current flowing from the second electrode to the first electrode and a reverse current as a current flowing from the first electrode to the second electrode, a current density of the reverse current is greater than a current density of the forward current.

2. The manufacturing method of a mask according to claim 1,
    wherein given a forward time as a time when the forward current is flowing and a reverse time as a time when the reverse current is flowing, the reverse time is shorter than the forward time.

3. A manufacturing method of a mask used when particles are vapor-deposited onto a display device during manufacture, the manufacturing method comprising:
    a film formation step for forming a metal layer including a plurality of openings on a mask substrate; and
    a shaping step for shaping the metal layer using pulse electrolysis; and
    a first resist layer formation step for forming a first resist layer provided with a plurality of space portions on the mask substrate; wherein,
    the film formation step forms the metal layer including the plurality of openings by removing the first resist layer after formation of the metal layer in the plurality of space portions.

4. The manufacturing method of a mask according to claim 3,
    wherein the film formation step forms the metal layer in the plurality of space portions using direct current electrolysis.

5. A manufacturing method of a mask used when particles are vapor-deposited onto a display device during manufacture, the manufacturing method comprising:
    a film formation step for forming a metal layer including a plurality of openings on a mask substrate; and
    a shaping step for shaping the metal layer using pulse electrolysis; wherein
    the shaping step includes a suppressing portion formation step for forming in each of the plurality of openings formed in the film formation step a suppressing portion configured to suppress expansion of the metal layer to inside a predetermined region of the plurality of openings, and a removal step for removing the suppressing portion formed in the suppressing portion formation step, after the shaping step.

6. The manufacturing method of a mask according to claim 5, further comprising:
a second resist layer formation step for forming, after the film formation step, a second resist layer on the mask substrate and on the metal layer formed in the film formation step; wherein
after the second resist layer formation step, the suppressing portion formation step forms the suppressing portion in the predetermined region by removing portions of the second resist layer other than the predetermined region.

\* \* \* \* \*